(12) United States Patent
Chen et al.

(10) Patent No.: US 8,764,245 B2
(45) Date of Patent: Jul. 1, 2014

(54) LED LIGHT BAR

(75) Inventors: Ming Chen, Shanghai (CN); Yonghong Qiu, Shanghai (CN); Liang Guo, Shanghai (CN); Jiye Wu, Shanghai (CN)

(73) Assignees: Shanghai Sansi Electronics Engineering Co., Ltd., Shanghai (CN); Shanghai Sansi Technology Co., Ltd., Shanghai (CN); Jiashan Sansi Photoelectric Technology Co., Ltd., Jiaxing, Zhejiang Province (CN)

( * ) Notice: Subject to any disclaimer, the term of this patent is extended or adjusted under 35 U.S.C. 154(b) by 254 days.

(21) Appl. No.: 13/338,224

(22) Filed: Dec. 27, 2011

(65) Prior Publication Data
US 2012/0162977 A1    Jun. 28, 2012

(30) Foreign Application Priority Data
Dec. 28, 2010    (CN) .......................... 2010 1 0619991

(51) Int. Cl.
*F21V 29/00*    (2006.01)

(52) U.S. Cl.
USPC .......................... 362/294; 362/373; 362/218

(58) Field of Classification Search
USPC ......... 362/218, 294, 373, 547, 580, 126, 264, 362/345, 249.02, 800
See application file for complete search history.

(56) References Cited

U.S. PATENT DOCUMENTS

| | | | |
|---|---|---|---|
| 7,267,461 B2 * | 9/2007 | Kan et al. ...................... | 362/373 |
| 7,572,027 B2 * | 8/2009 | Zampini et al. ............... | 362/218 |
| 2009/0103307 A1 * | 4/2009 | Shu ................................ | 362/294 |
| 2009/0310354 A1 * | 12/2009 | Zampini et al. ............... | 362/373 |
| 2011/0228534 A1 * | 9/2011 | Zhang et al. .................. | 362/294 |

* cited by examiner

*Primary Examiner* — Bao Q Truong

(57) ABSTRACT

A LED light bar includes several LED light sources and a bar light source mounting base. The light source mounting base is made of an insulating and heat-conducting material. An electrical layer having several metal electricity-conducting plates is embedded in an inner part of the light source mounting base. The LED light sources are welded on the metal electricity-conducting plates to form an electrical electricity-conducting circuit. lighting sides of the LED light sources are exposed on a surface of the light source mounting base. The light source mounting base and the metal electricity-conducting plates are formed into a whole. Each LED light source is covered by lenses.

2 Claims, 2 Drawing Sheets

LED LIGHT BAR

BACKGROUND OF THE PRESENT INVENTION

1. Field of Invention

The present invention relates to a field of LED lighting, and more particularly to a light bar of a LED lighting lamp having a high heat dissipating efficiency and a high protecting level.

2. Description of Related Arts

When a LED is used as a light source of a lighting lamp, main problems to be solved in designing are dissipating heats of the light source and waterproofness of the light lamps. For example, a conventional road lamp commonly has a front mask and a back cover to satisfy a requirement of dampproofness and waterproofness. However, such a structure condenses heats in a sealed space and causes unsatisfied heat dissipation results. The heavy structure also leads to a big weight and a big cost in materials of the whole lamp.

Besides, the conventional light source is installed integrally, which leads to great inconvenience in installing and maintaining, a low productive efficiency, a low level in scale and standardization.

According to a Chinese patent having an application number of 200920078033.2, a LED lighting lamp having a hollow structure is disclosed, which effectively solves the problems of heat dissipation and waterproofness to some extent. However, the LED light source is welded on a layer of circuit board, which adds a heat resistance to affect the heat dissipation to some degree. After the circuit board is put in a long slot, the slot is sealed through injecting glue. The glue body ages and falls apart with time so that insulation and waterproofness are affected.

SUMMARY OF THE PRESENT INVENTION

In order to solve problems mentioned above, the present invention provides a LED light bar having a good performance in dissipating heats, dampproofness and waterproofness, which is simply manufactured and used.

In order to realize the above purposes, the present invention adopts following technical solutions.

A LED light bar comprises several LED light sources and a bar light source mounting base. The light source mounting base is made of an insulating and heat conducting material. An electrical layer comprising several metal electricity-conducting plates is embedded in an inner part of the light source mounting base. The LED light sources are welded on the metal electricity-conducting plates to form an electrical electricity-conducting circuit. lighting sides of the LED light source are exposed on a surface of the light source mounting base. The light source mounting base and the metal electricity-conducting plates are formed into a whole. Each LED light source is covered by lenses.

A heat dissipating structure is provided on the light source mounting base.

The heat dissipating structure is provided on two sides of the light source mounting base.

The heat dissipating structure comprises a series of protuberances corresponding to each position of the LED light sources. The protuberances are hollow inside and have convex ribs on an outer wall thereof.

Heat dissipating plates are provided on a dark side of the light source mounting base.

The metal electricity-conducting plates are made of one material selected from the group consisting of gold, silver, copper, aluminum, aluminum alloy and copper alloy.

The LED light bar of the present invention has no circuit board for welding LED light sources and adopts metal electricity-conducting plates of highly heat-conducting which reduces the heat resistance and shortens heat-conducting paths to produce higher efficiency and better performance in dissipating heats. Moreover, the electrical electricity-conducting layer is provided in the inner part of the non-electricity-conducting light source mounting base. Thus results of effective dampproofness and waterproofness are realized without adopting other materials for sealing, and are free from limitations of service time and severe service environment. The light source mounting base and the central metal electricity-conducting plates are formed into a whole through plastic injection molding, which contributes to mass production and installation and effectively improves productive efficiency of lamps.

BRIEF DESCRIPTION OF THE DRAWINGS

Combined with drawings, further detailed description of technical solutions according to the present invention is following.

DETAILED DESCRIPTION OF THE PREFERRED EMBODIMENT

Figure 1:
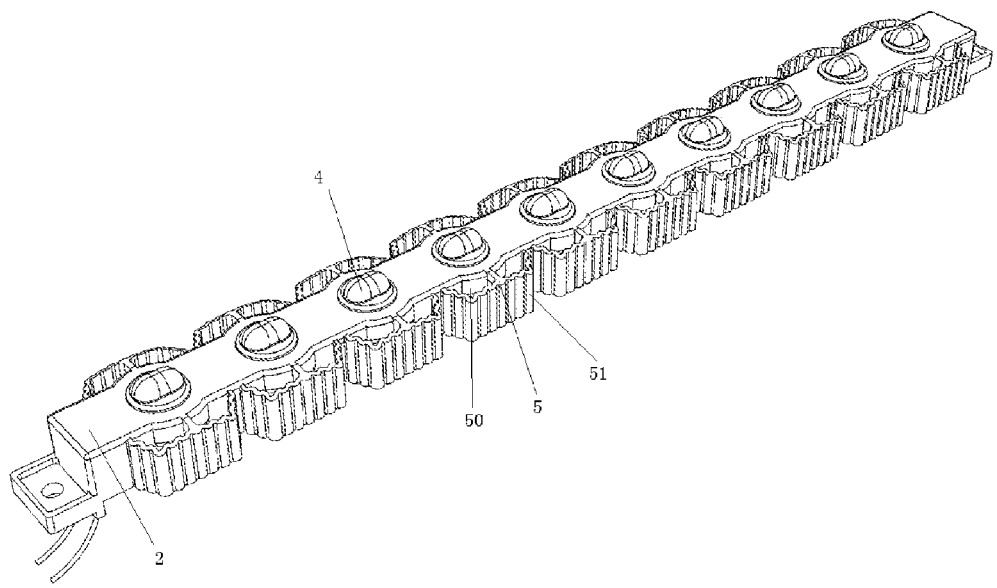
FIG. 1 is a sketch view of a structure of a light bar according to a preferred embodiment of the present invention.
Figure 2:
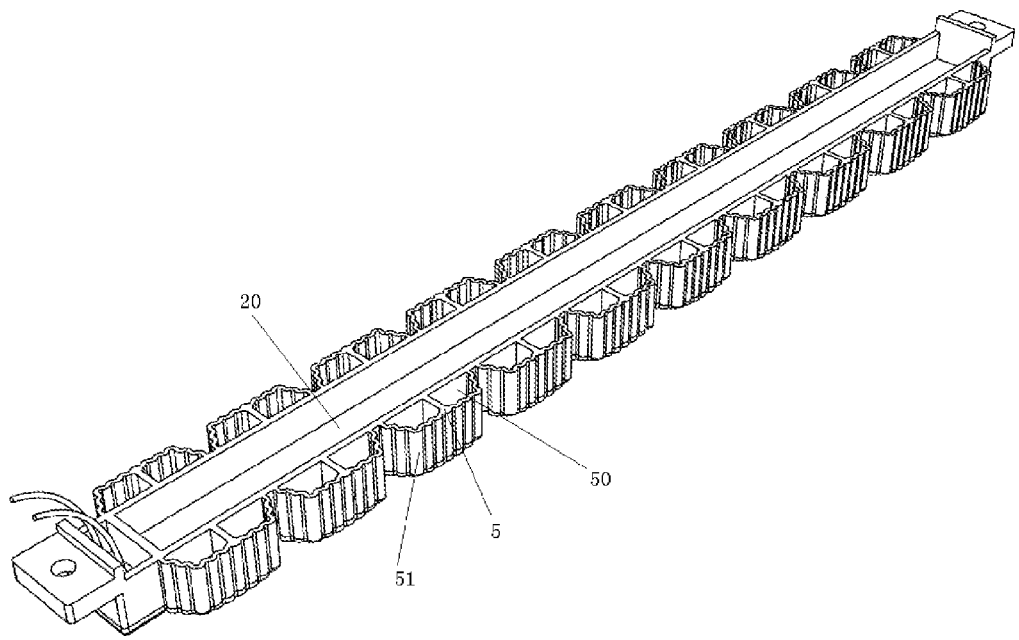
FIG. 2 is a sketch view of a dark side of the light bar shown in FIG. 1.
Figure 3:
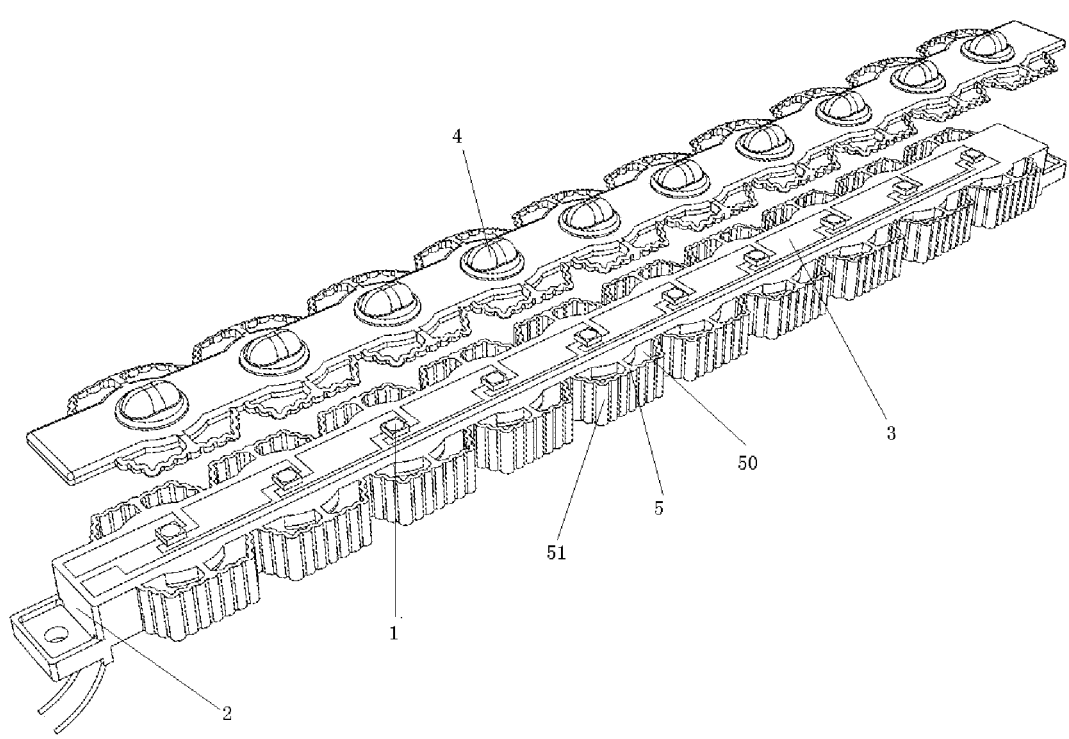
FIG. 3 is an exploded view of FIG. 1.

In FIG. 1, FIG. 2 and FIG. 3, according to a preferred embodiment of the present invention, a LED light bar is illustrated which comprising several LED light sources 1 and a bar light source mounting base 2. The light source mounting base 2 is made of insulating and heat-conducting materials. An electrical layer having several metal electricity-conducting plates is embedded in an inner part of the light source mounting base 2, wherein copper plates 3 of the metal electricity-conducting plates in the preferred embodiment have high heat-conducting coefficients. The light source mounting base 2 and the electrical layer comprising the copper plates 3 are formed into a whole through plastic injection molding. The several copper plates 3 are insulated connected with each other. Pins of positive electrodes and negative electrodes of the LED light sources 1 bridge among the copper plates connected with each other so as to form an electrical electricity-conducting circuit with the copper plates 3. Lighting sides of the LED light sources 1 are exposed on a surface of the light source mounting base 2 to maintain that lights from the LED light sources 1 are emitted out. Therefore, the lighting sides of the light source mounting base 2 have several holes opened thereon according to positions of the LED light sources 1 to install the LED light sources 1. In practical production, firstly the LED light sources 1 are placed at the locations for installing the LED light sources 1 on the molded LED light bar made through injecting plastic, and then the LED light sources 1 are welded through reflowing soldering. Finally lenses 4 are provided on each LED light source 1.

In the preferred embodiment of the present invention, a series of semi-ring protuberances 5 are provided at each position corresponding to each LED light source 1 on two sides of the light source mounting base 2 Inner sides of the protuberances 5 are in hollow shape and outer walls thereof are provided with a series of convex ribs 51. The hollow 50 allows heats dissipating through air convection. The convex ribs 51 enlarge a surface area of the light bar for dissipating heats so as to effectively improve efficiency in dissipating heats. A long slot 20 is provided at the back of the light source mounting base 2. A series of heat dissipation teeth in serration shapes are provided on walls of the long slot 20 to promote dissipating heats.

What is claimed is:

1. A LED light bar, comprising:
several LED light sources;
a bar light source mounting base, wherein said light source mounting base is made of an insulating and heat conducting material; an electrical layer comprising several metal electricity-conducting plates is embedded in an inner part of said light source mounting base; said LED light sources are welded on said metal electricity-conducting plates to form an electrical electricity-conducting circuit; lighting sides of said LED light sources are exposed on a surface of said light source mounting base which are formed with said metal electricity-conducting plates into a whole; lenses are provided and cover on each LED light source; and
a structure for dissipating heats which is provided on two sides of said light source mounting base; wherein said structure for dissipating heats comprises a series of protuberances which are provided at each position corresponding to each LED light source and hollow inside; convex ribs are provides on outer walls of said protuberances.

2. The LED light bar, as recited in claim 1, wherein said metal electricity-conducting plates are made of one material selected from the group consisting of gold, silver, copper, aluminum, aluminum alloy and copper alloy.

\* \* \* \* \*